United States Patent [19]

Margolies

[11] 3,935,475

[45] Jan. 27, 1976

[54] TWO-PHASE MOS SYNCHRONIZER
[75] Inventor: Arthur Margolies, Framingham, Mass.
[73] Assignee: GTE Laboratories Incorporated, Waltham, Mass.
[22] Filed: Aug. 27, 1974
[21] Appl. No.: 500,988

[52] U.S. Cl. ............... 307/208; 307/205; 307/279
[51] Int. Cl.² ................. H03K 19/08; H03K 3/26
[58] Field of Search .................. 307/205, 208, 279

[56] References Cited
UNITED STATES PATENTS

| | | | |
|---|---|---|---|
| 3,114,109 | 12/1963 | Melas | 307/208 |
| 3,145,309 | 8/1964 | Bothwell et al. | 307/208 |
| 3,488,478 | 1/1970 | Gilbert | 307/208 |
| 3,764,920 | 10/1973 | Galcik et al. | 307/208 |
| 3,813,563 | 5/1974 | Hatsukano et al. | 307/279 |
| 3,813,564 | 5/1974 | Hatsukano et al. | 307/279 |
| 3,832,578 | 8/1974 | Nomiya et al. | 307/279 |
| 3,840,757 | 10/1974 | Nomiya et al. | 307/279 |
| 3,854,059 | 12/1974 | Nomiya et al. | 307/279 |
| 3,870,897 | 3/1975 | Hatsukano et al. | 307/279 |

Primary Examiner—Stanley D. Miller, Jr.
Attorney, Agent, or Firm—Irving M. Kriegsman; Leslie J. Hart

[57] ABSTRACT

An MOS circuit synchronizes an asynchronous input signal to first and second alternating clock pulses in an integrated circuit system employing clocked ratio logic. A bistable device, such as a flip-flop, has first and second complementary inputs for establishing the state of the device and an output reflecting the state of the device. An input circuit for the bistable device receives the asynchronous signal and applies the signal to the first complementary input and the inverted asynchronous signal to the second complementary input. In addition, the input circuit has gate logic, implemented with field effect transistors, which decouples the asynchronous input for all intervals of time except during the interval of the first clock pulse. An output circuit for the bistable device employs an inverter in series with a field effect transistor which is driven into condition only during the interval of the second clock pulse. The MOS synchronizer circuit thus insures that an output signal of usable logic level is generated for an input signal occuring at any time with respect to the clock pulses of a clocked ratio MOS system.

5 Claims, 3 Drawing Figures

TWO-PHASE MOS SYNCHRONIZER

BACKGROUND OF THE INVENTION

The present invention is directed to a circuit for synchronizing an asynchronous input with a two-clock MOS system with particular utility in large scale integrated circuitry.

In conventional clocked ratio MOS digital systems, signal transition is only permitted within certain time intervals of the two-phase system. However, with an asynchronous input, transition may take place at any time, and it has been discovered that inherent difficulties result from the basic structure used in clocked ratio MOS logic should the input signal change close to the termination of a clock period.

In the prior logic circuits, a full and usable output level may not be developed when an input transition takes place near the trailing edge of a clock pulse. This phenomenon, when occuring, causes ambiguity in the logical state of a digital integrated circuit.

SUMMARY OF THE INVENTION

It is therefore the principal object of the present invention to insure an output of usable logic level in a clocked ratio MOS circuit for an input transition occurring at any time.

It is another object of the present invention to synchronize clocked ratio MOS logic with a minimum propagation delay and the least use of area when the synchronized circuit is fabricated in an integrated circuit form. The attached claims substantially summarize the means to accomplish these objects.

DETAILED DESCRIPTION OF THE PREFERRED EMBODIMENT

Figure 1:
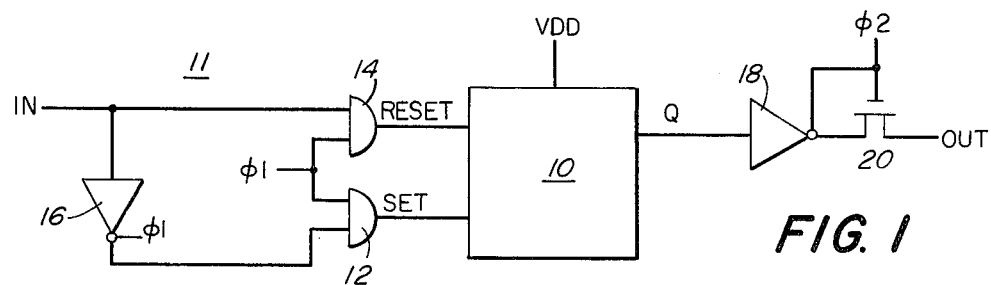
FIG. 1 is a simplified block diagram illustrating the principles of the present invention.

In understanding the advantages of the present invention, it is helpful to refer to the simplified block diagram of FIG. 1, illustrating the problems of the prior art and the principles of the present invention. A DC flipflop 10 is set and reset by AND gates 12 and 14, respectively. An input signal is fed to the gate 14 and through an inverter 16 to gate 12. A clock pulse $\phi 1$ provides the other input to both gates 12, 14, the AND gates and inverter forming the input circuitry 11 to the illustrative circuit.

The output of the flipflop 10 in the illustrative diagram of FIG. 1 is fed through an inverter 18 and series pass transistor 20 to the output of the illustrative circuit, the conduction of the transistor 20 being controlled by a second clock pulse $\phi 2$. It is to be understood that the clock pulses $\phi 1$, $\phi 2$ of the illustrative circuit are alternating in a fixed ratio and, of course, can be interchanged.

The input circuitry 11 may serve to illustrate the problems arising when there is a transition of the input pulse near the trailing edge of a clock pulse. If the full width of the clock pulse $\phi 1$ occurs during an information pulse, the SET and RESET inputs to the flipflop 10 will be pulses of full voltage level. However, if there is a transition of the input near the trailing edge of the clock pulse, the shortened length of the pulse output of the AND gates may result in an output pulse from the circuit involved which is not of usable logic level.

This phenomenon is particularly troublesome if the voltage level from the illustrative AND gate feeds or controls the feeding of, a capacitor or an element having inherent capacitive characteristics such as an MOS field effect transistor (MOSFET).

In the illustrative circuit, when a clock pulse $\phi 1$ is received during the continuance of a data input, the flipflop 10 will assume the proper state and normally a full output level will be read out during the clock time $\phi 2$.

However, if there is a transition of the input during the time period $\phi 1$, the inputs of the flipflop 10 may stand at fractional levels, such as half voltage, and the flipflop be unstable during the balance of the clock period.

The simplified circuit of FIG. 1 is also illustrative of the principles by which the solution of the problem in the present invention was arrived at for particular use in integrated circuit technology. Although the flipflop 10 may be unstable under the balance of the time period $\phi 1$, as set forth above, between the time periods $\phi 1$ and $\phi 2$, both the SET and RESET inputs to the flipflop 10 will be at zero voltage and the flipflop 10 will assume one or the other of its stable states, resulting in a full voltage level at Q, the output of the flipflop 10. A usable logic level will then be read out of the illustrative circuit of FIG. 1 upon the occurrence of the clock pulse $\phi 2$.

The flipflop 10 interposes a minimum delay in the overall circuitry and assures a pure logic level no matter when the input changes.

Figure 2:
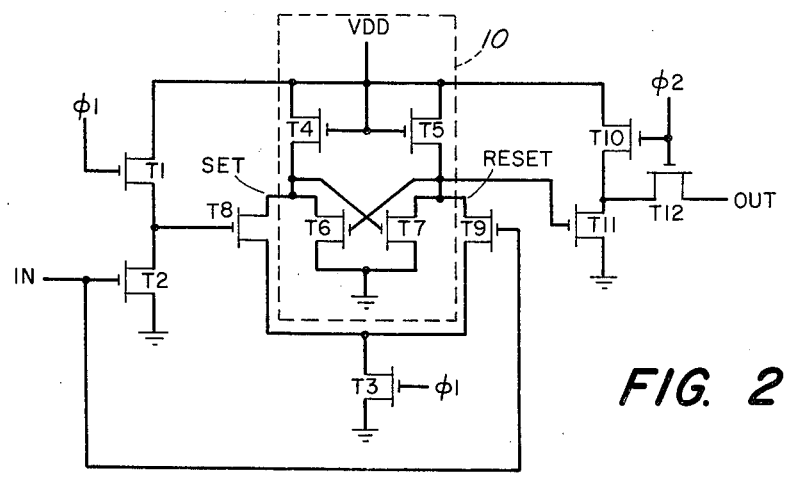
FIG. 2 is a detailed schematic circuit of the preferred embodiment of the invention suitable for MOS technology.

The dashed block 10 of FIG. 2 is a bistable circuit or flipflop having crossed-coupled field effect transistors T6 and T7 connected between a voltage source VDD and ground. Load transistors T4 and T5 connected between the voltage source VDD and the cross-coupled transistors T6 and T7, respectively, assure complementary voltages in both branches of the flipflop as known in the art.

The SET input to the flipflop 10 is taken between transistors T4 and T6 and the RESET input between transistors T5 and T7.

Transistors T3 and T9, connected between ground and the RESET input of flipflop 10 form an AND gate, the gate of T3 being controlled by the clock pulse $\phi 1$ and the gate of T9 being controlled by the input.

Transistors T3 and T8 connected between ground and the SET input of flipflop 10 form an AND gate, the gate of T3 being controlled by the clock pulse $\phi 1$ and the gate of T8 being controlled by the inverted input.

Transistors T1 and T2, serially connected between ground and VDD, form a standard inverter circuit in which the input signal is applied to the gate of T2 and the clock pulse $\phi 1$ applied to the gate of T1. The inverted input is taken off between the transistors T1 and T2 to control the gate of SET transistor T8.

The bistable circuit 10, composed of transistors T4, T5, T6 and T7, form in effect a DC latch. Transistors T8 and T9 are set to drive the latch into the proper state during the time period $\phi 1$ by presenting the input signal to the transistor T9 and the inverted input signal to the transistor T8.

The output Q of the flipflop 10 is taken between the transistors T7 and T5. The outputs $\overline{Q}$ and Q must assure a 1–0 or 0–1 state between the clock pulses $\phi1$ and $\phi2$, because the transistor T3 decouples all input levels except during the clock pulse $\phi1$.

Transistors T10 and T11 are serially connected between VDD and ground forming an inverter to interface with the DC latch 10, the output Q controlling the gate of transistor T11. A transistor T12 having one side connected between the transistors T10 and T11 forms the output to the synchronizer circuit of the invention. The gate of transistor T12 is controlled by the clock pulse $\phi2$ which prevents any changes in the output except during the clock pulse $\phi2$.

All the transistors of the circuitry of FIG. 2 are field effect transistors and preferably MOSFETS. The circuit is particularly suited for MOS large scale integrated circuitry.

Figure 3:
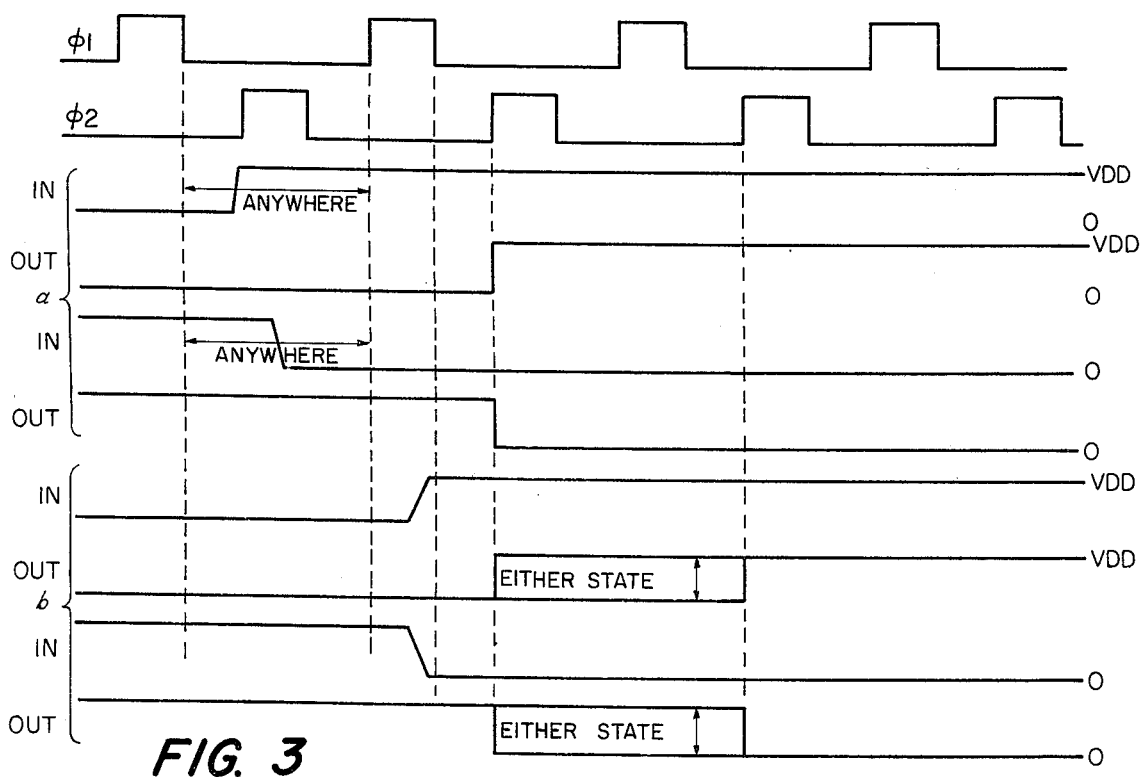
FIG. 3 is a timing diagram useful in understanding the invention.

The wave forms of FIG. 3 illustrate diagrammatically the relationship of the outputs to the inputs of the circuit of FIG. 2 during the $\phi1$ and $\phi2$ clock pulse trains. As shown in FIG. 3a, if the input goes high or low in normal sequence, i.e., not immediately preceding the trailing edge of the clock pulse $\phi1$, a full output voltage level concurs with the leading edge of the clock pulse $\phi2$.

On the other hand, as shown in FIG. 3b, if the input goes high or low immediately preceding the trailing edge of the clock pulse $\phi1$, the flipflop 10 assumes one of the two stable states in the time between $\phi1$ and $\phi2$, and assumes the correct state at the next $\phi1$. The proper voltage level will then be read out at the leading edge of $\phi2$. It is believed that this circuit is the most compact stable circuit designed to meet the requirements of providing the wave forms of FIG. 3 in MOS logic.

While in the preferred embodiment of the present invention a two phase MOS synchronizer has been described, it is to be understood that the principle of the present invention is equally applicable to MOS systems having greater than two phases.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A circuit for synchronizing an asynchronous signal in a system having at least alternating first and second clock pulses for clocked ratio logic comprising:
   a. bistable means receiving first and second complementary signals for establishing the state of said bistable means and generating an output signal reflecting the state of said bistable means;
   b. input means receiving the asynchronous signal and generating the first and second complementary signals, the input means including an input inverter receiving the first clock pulse, a single DC voltage and the asynchronous signal for generating an inverted asynchronous signal only during the occurence of the first clock pulse, a first AND gate receiving the asynchronous signal and the first clock pulse and generating one of the complementary signals only during the occurence of the first clock pulse and a second AND gate receiving the inverted asynchronous output signal and the first clock pulse and generating the other of the complementary signals only during the occurence of the first clock pulse; and
   c. output means receiving the output signal from the bistable means and generating a high drive, circuit output signal having one of two predetermined voltage levels whose transitions correspond generally to those of the asynchronous input and are synchronized to the clock pulses, the output means including an output inverter receiving the single DC voltage, the second clock pulse and the output signal of the bistable means for generating an inverted output signal only during the occurence of the second clock pulse, the inverter being effective to produce an output having high drive capability to protect the bistable means from loading effects of the output of the circuit, and an output field effect transistor connected to the output of the output inverter and receiving at a gate electrode the second clock pulse so that the output transistor is controlled by the second clock pulse, the circuit being effective to produce a full logic level output signal when the transition of the asynchronous input signal occurs during the interval of the first clock pulse.

2. The circuit of claim 1 wherein said bistable means includes first and second cross-coupled field effect transistors, corresponding respectively to said first and second complementary inputs and said AND gates each comprises a field effect transistor serially connected to an individual one of said cross-coupled transistors and a control field effect transistor serially connected between each of said AND gate transistors and ground, the gate of said control transistor being controlled by said first clock pulse, and the gates of said AND gate transistors being controlled, respectively, by said asynchronous input and said asynchronous inverted input.

3. The circuit of claim 2 wherein said input inverter includes an input field effect transistor serially connected between ground and the gate of said AND gate transistor connected to said second cross-coupled transistor, said asynchronous input controlling the gate of said input transistor and the gate of said AND gate transistor connected to said first cross-coupled transistor and a field effect transistor serially connected between the DC voltage and the gate of the AND gate transistor connected to said second cross-coupled transistor and having a gate electrode receiving the first clock pulse.

4. The circuit according to claim 3 wherein each of said field effect transistors is a MOSFET.

5. The circuit according to claim 3 wherein the output inverter includes a pair of field effect transistors T10 and T11 connected in series between ground and the DC voltage, the gate of transistor T11 receiving the output of the bistable means and the gate of the transistor T10 receiving the second clock pulse.

* * * * *